US007933760B2

(12) United States Patent
Schreiber et al.

(10) Patent No.: US 7,933,760 B2

(45) Date of Patent: Apr. 26, 2011

(54) BITCELL SIMULATION DEVICE AND METHODS

(75) Inventors: Russell Schreiber, Austin, TX (US); Keith Kasprak, Austin, TX (US); Donald A. Priore, Groton, MA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 608 days.

(21) Appl. No.: 12/054,471

(22) Filed: Mar. 25, 2008

(65) Prior Publication Data

US 2009/0248383 A1 Oct. 1, 2009

(51) Int. Cl.
*G06F 17/50* (2006.01)

(52) U.S. Cl. ................. 703/14; 703/2; 702/57; 702/179

(58) Field of Classification Search ................ 703/2, 13, 703/14; 702/57, 179, 182; 365/154, 190; 716/100

See application file for complete search history.

(56) References Cited

U.S. PATENT DOCUMENTS 6,181,626 B1 * 1/2001 Brown ........................ 365/210.1
6,529,436 B1 * 3/2003 Brown .......................... 365/226
6,738,953 B1 * 5/2004 Sabharwal et al. ........... 716/103
7,546,562 B1 * 6/2009 Scheffer ........................ 716/100
7,672,152 B1 * 3/2010 Kulkarni et al. .............. 365/154
7,706,174 B2 * 4/2010 Pradhan et al. ............... 365/156

OTHER PUBLICATIONS

Calhoun et al., Analyzing Static Noise Margin for Sub-Threshold SRAM in 65nm CMOS, Proceedings of the 31st European Solid-State Circuits Conference, Sep. 2005, pp. 363-366.*

Wang et al., Statistical Modeling for the Minimum Standby Supply Voltage of a Full SRAM Array, 33rd European Solid-State Circuits Conference, Sep. 2007, pp. 400-403.*

Calhoun et al., Static Noise Margin Variation for Sub-Threshold SRAM in 65-nm CMOS, IEEE Journal of Solid-State Circuits, vol. 41, No. 7, Jul. 2006, pp. 1673-1679.*

* cited by examiner

*Primary Examiner* — Russell Frejd

(57) ABSTRACT

A method of simulating operation of a bitcell includes determining sensitivities of a bitcell model to different component characteristics and device parameters, such as device temperature, operating voltage, and process characteristics. The determined sensitivities are normalized, so that each normalized value represents the relative sensitivity of the bitcell, under the simulated device parameters, to the component characteristic associated with the value. The normalized sensitivity values can be scaled based on a tolerance factor, and the adjusted sensitivities used to model the behavior of each component of the bitcell in subsequent simulations.

19 Claims, 5 Drawing Sheets

302 SET DEVICE PARAMETERS
304 SET COMPONENT CHARACTERISTICS FOR ALL COMPONENTS TO NOMINAL VALUES
306 DETERMINE CHARACTERISTICS TO BE TESTED
308 SET TESTED CHARACTERISTIC TO FIRST TEST VALUE
310 TEST SENSITIVITY TO OBTAIN SENSITIVITY1
312 SET TESTED CHARACTERISTIC TO SECOND TEST VALUE
314 TEST SENSITIVITY TO OBTAIN SENSITIVITY2
316 DETERMINE SENSITIVITY BASED ON SENSITIVITY1 AND SENSITIVITY2
318 STORE SENSITIVITY FOR TESTED CHARACTERISTIC
320 ALL CHARACTERISTICS TESTED ? N Y
322 NORMALIZE SENSITIVITY INFORMATION
324 STORE NORMALIZED SENSITIVITY INFORMATION
326 ALL DEVICE PARAMETER SETS TESTED ? N Y
328 END

BITCELL SIMULATION DEVICE AND METHODS

FIELD OF THE DISCLOSURE

The present disclosure relates to simulation of integrated circuit devices, and more particularly to simulation of bitcells in integrated circuit devices.

BACKGROUND

In the design of an integrated circuit device, it is typically useful to simulate functional modules of the device, such as memory (e.g. a cache), prior to building physical device samples, in order to ensure that in operation the device will comply with a specification. Accordingly, in the design process of an integrated circuit memory, bitcell models are used to simulate operation of physical bitcells of the memory. In the simulation process it is desirable to determine the extent of potential variability in the operation of a bitcell, so that the variability in bitcell operation can be accounted for in the design of the integrated circuit device.

One method of determining the variability of a bitcell includes simulating operation of the bitcell while randomly varying each of a number of component characteristics such as transistor threshold voltage, transistor channel length, and transistor channel width, for each transistor of the bitcell. However, this process can require an undesirable amount of time. For example, for a bitcell having 6 transistors with three component characteristics for each transistor, millions of simulations are run in order to determine bitcell variability, requiring hours or days of simulation time. Alternatively, the operation of the memory module can be simulated assuming that each component characteristic of the bitcell is at a specified worst-case variation from nominal values. However, these assumptions typically will not accurately reflect actual operating conditions of the memory module. Accordingly, an improved method for simulating operation of a bitcell would be desirable.

DESCRIPTION OF THE DRAWINGS

A method of simulating operation of a bitcell includes determining sensitivities of a bitcell model to different component characteristics and device parameters, such as device temperature, operating voltage, and process characteristics. The determined sensitivities are normalized, so that each normalized value represents the relative sensitivity of the bitcell, under the simulated device parameters, to the component characteristic associated with the value. The normalized sensitivity values can be scaled based on a tolerance factor, and the adjusted sensitivities used to model the behavior of each component of the bitcell in subsequent simulations.

Figure 1:
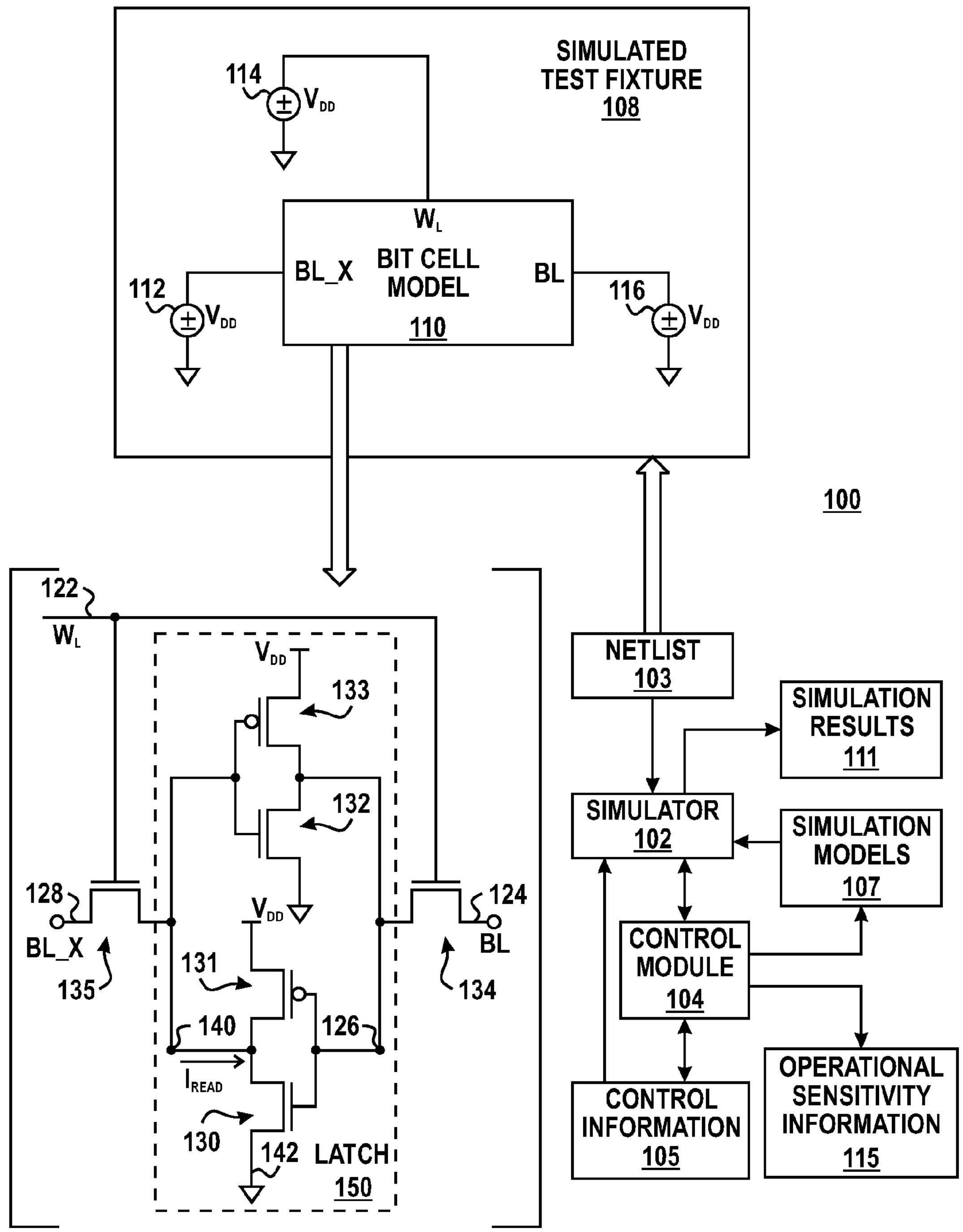
FIG. 1 is a combined block and circuit diagram of a system for determining sensitivity of a bitcell to component characteristics in accordance with one embodiment of the present disclosure.

FIG. 1 illustrates a combined block and circuit diagram of a particular embodiment of a system 100 for determining sensitivity of a bitcell to different component characteristics. As used herein, the term component characteristic refers to a characteristic, such as a threshold voltage, channel length, or channel width, of a particular component, such as a transistor of the bitcell. In an embodiment, component characteristics are uniquely identified with particular components and particular characteristics. For example, as used herein, the notation $V_{TH\text{-}148}$ refers to the threshold voltage for transistor 148, while $V_{TH\text{-}146}$ refers to the threshold voltage for transistor 146. As described herein, $V_{TH\text{-}148}$ and $V_{TH\text{-}146}$ are each a unique component characteristic for a bitcell. The sensitivities for each component characteristic can also vary depending on device parameters for the bitcell. As used herein, device parameters refer to conditions of an integrated circuit device that can impact operation of each device component. Examples of device parameters include device temperature, operating voltage, and the semiconductor process used to form the integrated circuit device.

The system 100 includes a simulator 102, a netlist 103, a control module 104, control information 105, simulation models 107, a simulated test fixture 108, and operational sensitivity information 115. The simulation models 107 include a set of models to simulate the function of components of an integrated circuit device. In particular, the simulation models 107 can include silicon simulation models of basic components of an integrated circuit device, such as transistors, resistors, capacitors, and the like, and can also include functional models for more complex components, such as latches, logic gates, and the like. Each of the simulation models 107 defines the behavior of the associated component based on particular component characteristics. For example, the simulation model of a transistor can define the behavior of the transistor based on component characteristics such as threshold voltage, channel length, and channel width.

The netlist 103 includes information to indicate the configuration and relationship of one or more of the simulation models 107 in order to simulate a more complex component. For example, in the illustrated embodiment of FIG. 1, the netlist 103 reflects a configuration of transistors and other components to define the simulated test fixture 108 in order to simulate operation of a physical bitcell.

The control module 104 controls a simulation based on user entered information. For example, the control module 104 can provide an interface allowing a user to designate the netlist 103, the library including simulation models 107, and other information including simulation conditions (e.g. device parameters). The information can also include component characteristics for each device component being simulated. For example, for each transistor being simulated, the control module 104 can set forth the channel length, channel width, threshold voltage, and other component characteristics. In an embodiment, the control module 104 expresses the value for each component characteristic based on a distribution of possible values for the characteristic. The distribution for each characteristic is based on a known characteristic distribution for the component being simulated. Thus, the value for a particular component characteristic can be expressed based on a nominal value (e.g. an average or mean value) for that characteristic and a number of standard deviations that the characteristic value deviates from the nominal value. For example, the control module 104 can express the value for the channel length of a transistor as 0.5σ (where σ indicates the standard deviation), indicating the channel length value is equivalent to a nominal value plus one-half of a standard deviation. The control module 104 can also include multiple values, or ranges of values, for each component characteristic so that the integrated circuit device will be simulated with each of the characteristic values.

The control module 104 can also include other simulation control information, such as the type of simulation to be performed. Thus, in the illustrated example of FIG. 1, the control module 104 includes control information indicating that the simulator 102 should obtain operational sensitivity information for the bitcell model 110.

The control information 105 stores the information provided by the control module 104 in a format that can be interpreted by the simulator 102 to perform one or more simulations. Thus, the control information 105 can reflect simulation parameters, requested results, and other information to control a simulation at the simulator 102.

The simulator 102 is configured to simulate operation of a physical device based on input information. In particular, the simulator 102 models operation of a circuit defined by the netlist 103 and the simulation models 107. Further, the simulator simulates the behavior and operating characteristics of the modeled circuit based on the component characteristic and device parameter information stored at the control information 105. In addition, the simulator 102 is configured to provide simulation results 111 based on the simulated behavior and operating characteristics of the modeled device. The particular simulation results recorded at the simulation results 111 are determined by the simulator based on the control information 105. Examples of the simulation results 111 can include voltages at particular nodes of the netlist 102, currents through particular nodes, and the like. In addition, the simulator 102 can provide simulation results to the control module 104 for processing. Thus, in the illustrated example of FIG. 1, the simulator 104 provides simulation results to the control module 104 for determination of the operational sensitivity information 115.

In the illustrated embodiment of FIG. 1, the netlist 103 defines the simulated test fixture 108 so that operation of the simulated test fixture 108 is simulated at the simulator 102. In particular, the simulated test fixture 108 includes the bitcell model 110 and voltage sources 112, 114, and 116. It will be appreciated that although for ease of discussion the voltage sources 112-116, as well as the components of the bitcell 110, are illustrated and described as physical components, these components reflect simulated behavior of the illustrated components at the simulator 102.

The bitcell model 110 includes pass gates (e.g. transistors) 134 and 135, and a latch 150 including transistors 130, 131, 132, and 133. In addition, the bitcell model includes a word line 122, labeled "WL", a bitline 124, labeled "BL" and a bitline 128, labeled "BL_X." The transistor 134 includes a source connected to the bitline 124, a drain, and a control electrode connected to the word line 122. The transistor 135 includes a source connected to the bitline 124, a drain, and a control electrode connected to the word line 122. The transistor 130 includes a drain connected to the second current electrode of the transistor 135, a source connected to a ground reference voltage, and a control electrode connected to the second current electrode of the transistor 134. The transistor 131 includes a source connected to a reference voltage labeled "VDD", a source connected to the drain of the transistor 135, and a control electrode connected to the second current electrode of the transistor 134. The transistor 132 includes a source connected to the second current electrode of the transistor 134, a drain connected to the ground reference voltage, and a control electrode connected to the second current electrode of the transistor 135. The transistor 133 includes a drain connected to the reference voltage labeled "VDD", a source connected to the drain of the transistor 134, and a control electrode connected to the second current electrode of the transistor 135.

The voltage source 112 includes a terminal connected to the bitline 128 and a terminal connected to the ground reference voltage. The voltage source 114 includes a terminal connected to the word line 122 and a terminal connected to the ground reference voltage. The voltage source 116 includes a terminal connected to the bitline 124 and a terminal connected to the ground reference voltage.

In the illustrated embodiment of FIG. 1, the system 100 is configured to determine operational sensitivity information for the bitcell model 110. Accordingly, during simulation of the bitcell model 110 at the simulator 102, the control module 104 sets the voltage at each of the voltage sources 112, 114, and 116 to be substantially the same as the voltage reference $V_{DD}$. In addition, the voltage at the nodes 126 of the latch 150 is set to an initial value representing a logic "high", while the voltage at the node 140 is set an initial value representing a logic "low." This set of conditions causes the transistors 134, 135, 130 and 133 to become conductive. This in turn causes a simulated read current for the bitcell, labeled $I_{READ}$, to flow from voltage source 112 through node 140 and to node 142.

The current $I_{READ}$ will vary based on changes in the component characteristics of the bitcell model 110, as well as changes in average conditions for the integrated circuit associated with the bitcell model 110. In particular, the current $I_{READ}$ will vary based on changes in the threshold voltage, channel width, and channel length of each of the transistors 130-135. In addition, the current $I_{READ}$ will vary based on the average threshold voltage for p-channel transistors of the integrated circuit device associated with the bitcell model 110, the average threshold voltage for n-channel transistors of the integrated circuit device, the average channel length for transistors of the integrated circuit device, and the average channel width for transistors of the integrated circuit device. The amount of variation of the current $I_{READ}$ due to changes in each component characteristic can be different. For example, the amount of variation in the current $I_{READ}$ due to changes in the channel length of the transistor 131 can be different than the amount of variation in the current $I_{READ}$ due to changes in the threshold voltage of the transistor 133. Accordingly, the amount of variation in the current $I_{READ}$ for a particular component characteristic reflects the operational sensitivity of the bitcell model 110 to changes in that characteristic.

To determine the operational sensitivity for a component characteristic, the simulator 102 sets the value for all other component characteristics of the bitcell 110 to their nominal values. The simulator 102 then sets the value of the component characteristic being tested to a first value. In an embodiment, this value is equivalent to −0.5σ of the nominal value for the component characteristic. The simulator 102 then determines the current $I_{READ}$ to obtain a current $I_{READ1}$. The simulator 102 subsequently sets the value of the component characteristic being tested to a second value, such as 0.5σ, and determines the current $I_{READ}$ to obtain a current $I_{READ2}$. To obtain a sensitivity value for the component characteristic being tested, the simulator 102 subtracts IREAD1 from IREAD2 and divides the result by the difference of the component characteristic values that were tested, expressed in terms of the standard deviation for the component characteristic.

For example, to obtain operational sensitivity information for $V_{TH\text{-}130}$ (i.e. the threshold voltage for the transistor 130), the simulator 102 sets the values for all other component characteristics to their nominal values. Thus, the threshold voltages, channel length, and channel widths for the transistors 131-135 are each set to their nominal values, as are the values for $CW_{130}$ (i.e. the channel width for transistor 130) and $CL_{130}$ (i.e. the channel length for transistor 130). In addition, the average conditions for the integrated circuit associated with the bitcell model 110 are also set to their nominal values. The simulator 102 then sets the value for $V_{TH\text{-}130}$ to $-0.5\sigma$ and determines the current $I_{READ}$ to obtain the current $I_{READ1}$. The simulator 102 subsequently sets the value for $V_{TH\text{-}130}$ to $0.5\sigma$ and determines the current $I_{READ}$ to obtain the current $I_{READ2}$. The simulator 102 then obtains a sensitivity value following calculation:

$$SV[V_{TH-130}] = \frac{IREAD2 - IREAD1}{\sigma_2 - \sigma_1}$$

where $SV[V_{TH\text{-}130}]$ reflects the sensitivity of the bitcell model 110 to changes in the threshold voltage for the transistor 130, and $\sigma_1$ and $\sigma_2$ are the values of $V_{TH\text{-}130}$ associated with IREAD1 and IREAD2, respectively, expressed as function of the standard deviation for those values. In this example, $\sigma_1$ is equal to $-0.5$ and $\sigma_2$ is 0.5.

The simulator 102 obtains sensitivity values for each specified component characteristic, including average integrated circuit conditions, for the bitcell model 110. After all sensitivity values have been obtained, the simulator 102 normalizes the sensitivity values. In an embodiment, the sensitivity values are normalized so that the sum of the squares of all the values is equal to one. The simulator 102 provides the normalized sensitivity values to the control module 104, which stores the normalized values at the operational sensitivity information 115. Thus, the simulator 102 determines sensitivity information for the bitcell model 110 without conducting a large number of random simulations, allowing the information to be determined more quickly than with conventional methods.

Figure 2:
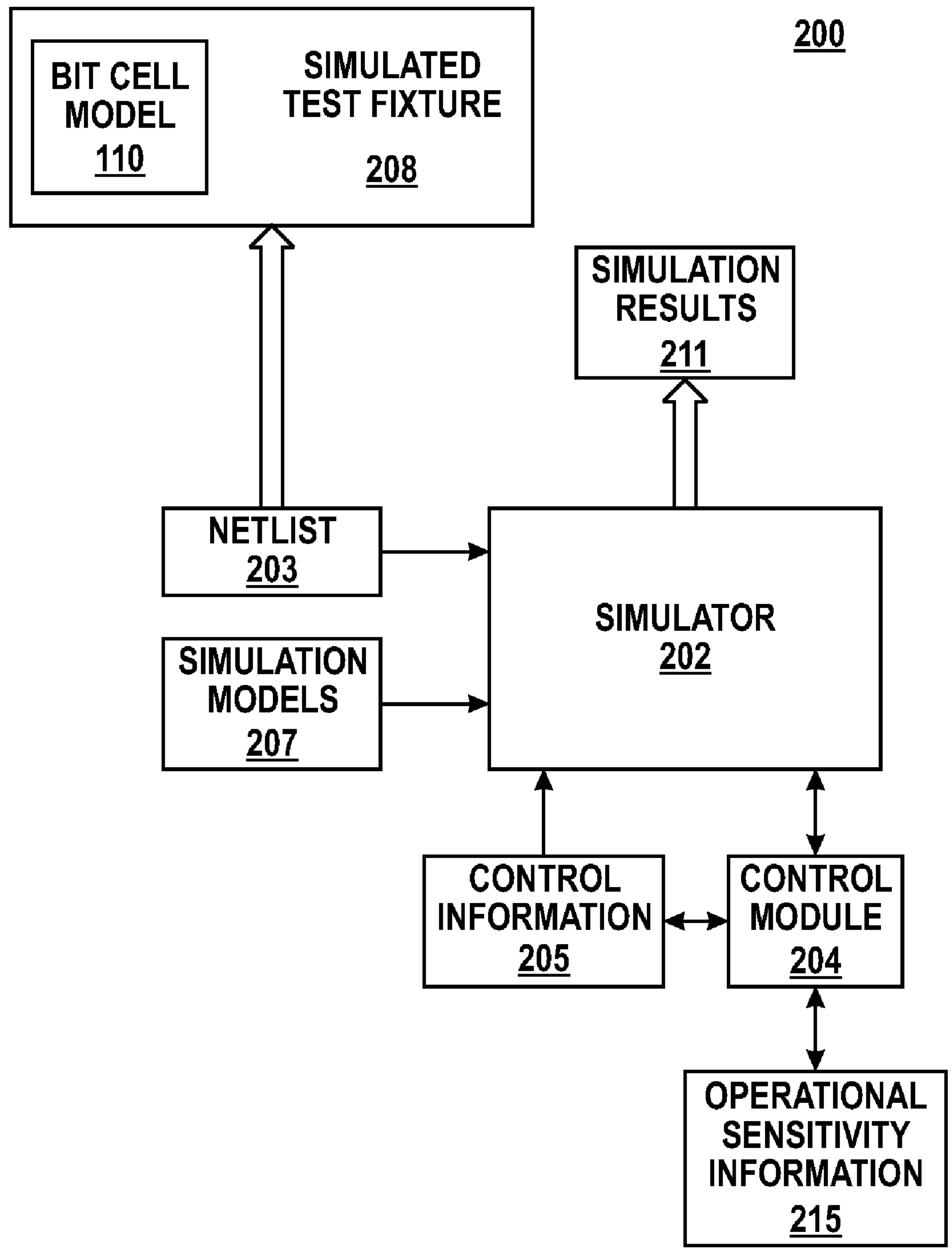
FIG. 2 is a combined block and circuit diagram of a system for simulating operation of a bitcell in accordance with one embodiment of the present disclosure.

The normalized sensitivity values stored at the operational sensitivity information 115 reflect the relative sensitivity of the bitcell model 110 to different component characteristics. Accordingly, the operational simulation information 115 can be used to improve the accuracy and utility of simulations including the bitcell model 110. This can be better understood with reference to FIG. 2, which illustrates a system 200 for simulating operation of a bitcell. The system 200 includes a simulator 202, a netlist 203, a control module 204, control information 205, simulation models 207, and operational sensitivity information 215. Each of the illustrated items is similarly configured and performs similar functions to its correspondingly numbered counterpart of FIG. 1.

In operation, the system 200 simulates operation of simulated test fixture 208 defined by the netlist 203, and stores the results at simulation results 211. In the illustrated embodiment of FIG. 2, the simulated test fixture 208 represents a test fixture for the bitcell 110. Operation of the bitcell model 110 is simulated by applying transient signals to one or more of the word line 122, the bitline 124, and the bitline 128, and recording specified operational characteristics, such as the current $I_{READ}$, of the bitcell model 110.

The values of the simulated operational characteristics will depend in part on the component characteristics for the bitcell model 110. To determine the component characteristics, the control module 204 accesses the normalized sensitivity values set forth in the operational sensitivity information 215. In addition, the control module 204 determines a tolerance factor, which indicates a specified amount of variation in the nominal behavior of the bitcell model 110 to be simulated. In an embodiment, the tolerance factor is expressed as a number of standard deviations from a nominal value. The control module 204 multiplies the normalized sensitivity values by the tolerance factor, and provides the resulting values to the simulator 202. Based on these values, the simulator 202 sets the values for the component characteristics of the bitcell model 110.

This process can be better understood with reference to an example. In this example, the normalized sensitivity value associated with $V_{TH\text{-}133}$ is 0.2, while the normalized sensitivity value associated with $CW_{130}$ (i.e. the channel width of transistor 130) is 0.4. These values indicate that the bitcell model 110 is more sensitive to variations in the channel width of transistor 130 than in the threshold voltage of the transistor 133. In the example, the tolerance factor 207 is 6. Accordingly, the control module 204 multiplies the sensitivity values by the tolerance factor to obtain adjusted values of 1.2 for $V_{TH\text{-}133}$ and 2.4 for $CW_{130}$. The simulator 202 therefore sets the threshold voltage for the transistor 133 to be $1.2\sigma$ and the value of the channel width for the transistor 130 to be $2.4\sigma$, and simulates operation of the bitcell using these component characteristics for the bitcell model 110.

Accordingly, by using the normalized sensitivity values the simulator 202 will simulate operation of the bitcell using component characteristic values that vary from nominal values according to the sensitivity of the characteristic. Thus, the more sensitive a bitcell's operation is to a particular component characteristic, the more that characteristic will deviate from its nominal value during simulation. This provides for more accurate representation of the potential variability of the bitcell model 110 at the simulator 202.

Figure 3:
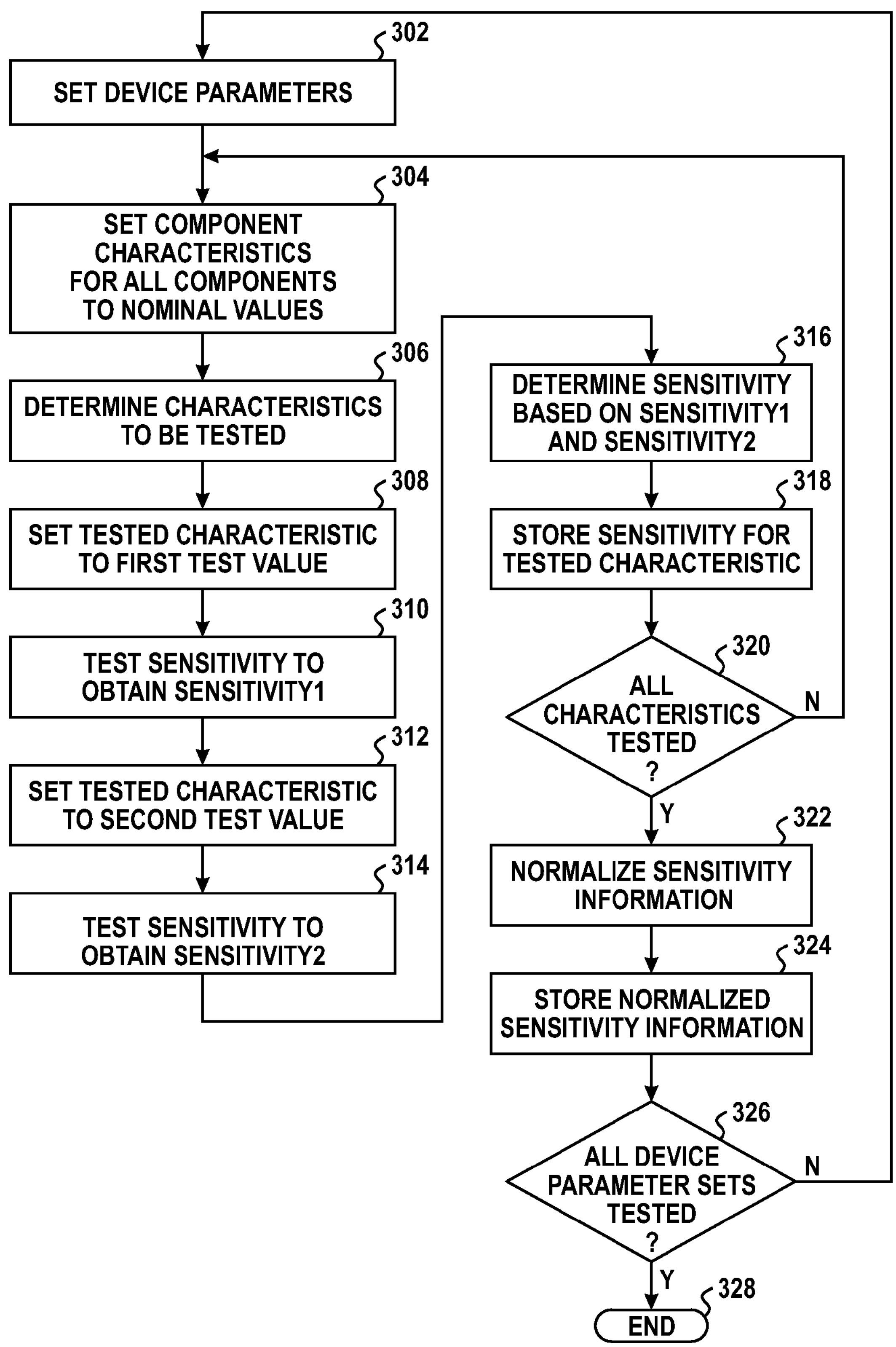
FIG. 3 is a flow diagram of a method of determining sensitivity of a bitcell to component characteristics, in accordance with one embodiment of the present disclosure.

Referring to FIG. 3, a flow diagram of a particular embodiment of a method of determining sensitivity of a bitcell is illustrated. At block 302, the device parameters for an integrated circuit associated with the bitcell are set. These parameters can include operating voltage, temperature, semiconductor process, and the like. At block 304, component characteristics for all components of the bitcell, including average characteristics for the integrated circuit, are set to nominal values.

At block 306, the simulator determines the component characteristic to be tested, referred to herein as the tested characteristic. At block 308, the tested characteristic is set to a first test value, such as $-0.5\sigma$. At block 310, the sensitivity of the bitcell is tested to determine the value SENSITIVITY1. In an embodiment, the sensitivity of the bitcell is tested by determining a read current for the bitcell.

At block 312, the tested characteristic is set to a second test value, such as $0.5\sigma$. At block 314, the sensitivity of the bitcell is determined to obtain the value SENSITIVITY2. At block 316, a sensitivity value for the tested characteristic is determined based on the values SENSITVITY1 and SENSITIVITY2. In an embodiment, the sensitivity value is obtained by subtracting SENSITIVITY2 from SENSITIVITY1. At block 318, the sensitivity value for the tested characteristic is stored.

At block 320, it is determined whether sensitivity values have been obtained for all specified component characteristics for the specified set of device parameters. If not, the method flow returns to block 304 to test another component characteristic. Accordingly, the method ensures that all specified component characteristics are tested for a specified set of device parameters. If, at block 320, it is determined that sensitivity values have been obtained for all specified component characteristics, the method flow moves to block 322 and the stored sensitivity values are normalized to obtain normalized sensitivity information. At block 324 the normalized sensitivity information is stored. In an embodiment, the stored normalized sensitivity information will indicate the set of device parameters associated with the sensitivity information.

At block 326, it is determined whether normalized sensitivity values have been obtained for all specified sets of device parameters. If so, the method flow proceeds to block 328 and the method ends. If not, the method flow returns to block 302 and another set of specified device parameters are determined. Thus, the illustrated method allows for normalized sensitivity information of the bitcell to be determined for different sets of specified device parameters.

Figure 4:
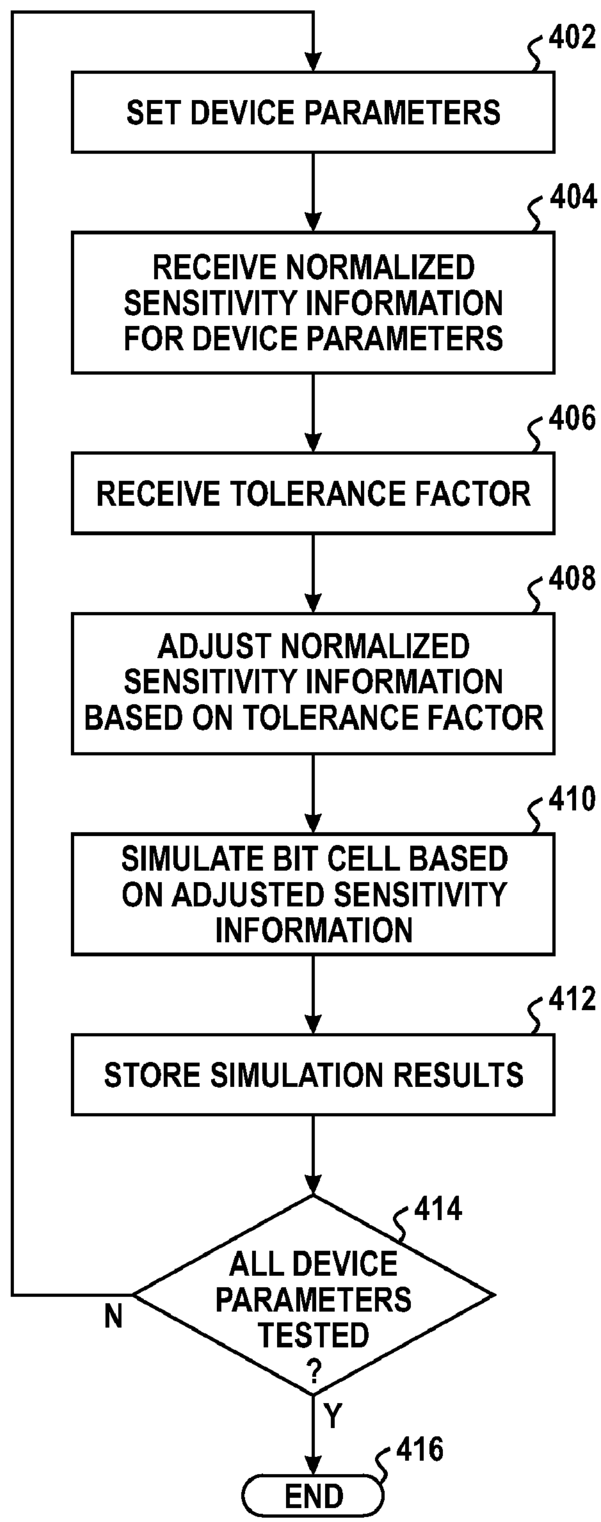
FIG. 4 is a flow diagram of a method of simulating operation of a bitcell in accordance with one embodiment of the present disclosure.

Referring to FIG. 4, a flow diagram of a particular embodiment of a method for simulating operation of a bitcell. At block 402, device parameters for an integrated circuit device associated with the bitcell are set. At block 404, normalized sensitivity information associated with the set of device parameters are received. At block 406, a tolerance factor for the simulation is received. In an embodiment, the tolerance factor reflects a number of standard deviations from a nominal value.

At block 408, the received normalized sensitivity information is adjusted based on the tolerance factor. In an embodiment, the normalized sensitivity information reflected normalized sensitivity values for each of a number of component characteristics of the bitcell to be simulated, and the normalized values are adjusted by multiplying each value by the tolerance factor. At block 410, operation of the bitcell is simulated based on the adjusted sensitivity information. For example, the adjusted normalized sensitivity values can be used to set the value of each associated component characteristic of the bitcell. At block 412, results of the simulation are stored.

At block 414, it is determined whether simulation results have been obtained for all specified sets of device parameters. If so, the method flow moves to block 416 and the method ends. If not, the method flow returns to block 402 and another specified set of device parameters are set for simulation. Accordingly, the illustrated method allows for simulation results to be obtained for a number of sets of device parameters, with individual sensitivity information for each set.

Figure 5:
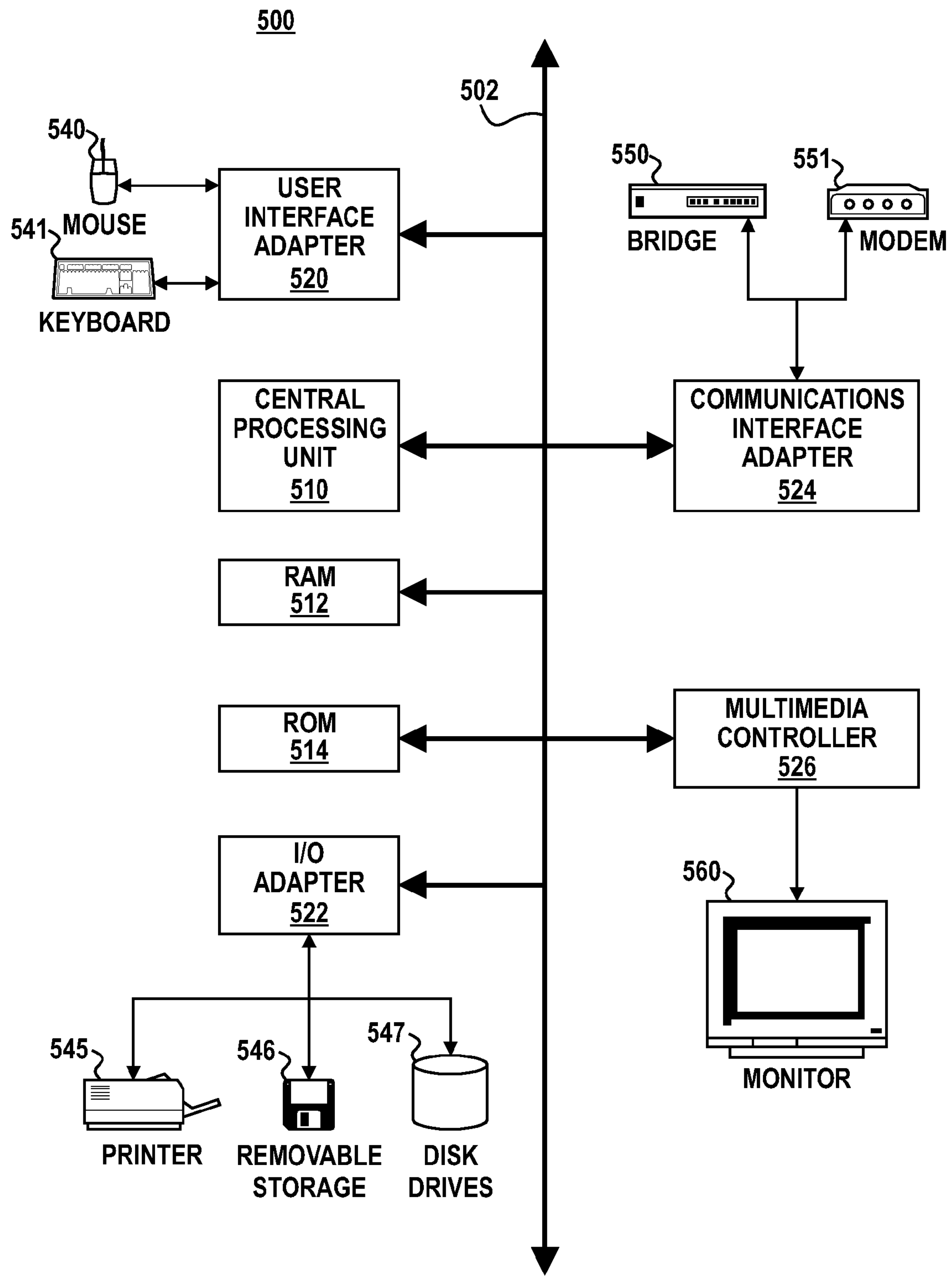
FIG. 5 is a block diagram of a computer device in accordance with one embodiment of the present disclosure.

FIG. 5 illustrates, in block diagram form, a processing device in the form of a personal computer system 500. The computer system 500 is illustrated to include a central processing unit 510, which may be a conventional proprietary data processor, memory including random access memory 512, read only memory 514, and input output adapter 522, a user interface adapter 520, a communications interface adapter 524, and a multimedia controller 526. The input output (I/O) adapter 526 is further connected to, and controls, disk drives 547, printer 545, removable storage devices 546, as well as other standard and proprietary I/O devices.

The user interface adapter 520 can be considered to be a specialized I/O adapter. The adapter 520 is illustrated to be connected to a mouse 540, and a keyboard 541. In addition, the user interface adapter 520 may be connected to other devices capable of providing various types of user control, such as touch screen devices. The communications interface adapter 524 is connected to a bridge 550 such as is associated with a local or a wide area network, and a modem 551. By connecting the system bus 502 to various communication devices, external access to information can be obtained. The multimedia controller 526 will generally include a video graphics controller capable of displaying images upon the monitor 560, as well as providing audio to external components (not illustrated).

Generally, the system 500 will be capable of implementing the system and methods described herein. For example, the RAM 512, ROM 514, and disk drives 547 are each computer readable media that can store a computer program including instructions to manipulate the central processing unit 510 to perform one or more of the methods described herein.

Other embodiments, uses, and advantages of the disclosure will be apparent to those skilled in the art from consideration of the specification and practice of the disclosure disclosed herein. It will further be appreciated that, although some circuit elements and modules are depicted and described as connected to other circuit elements, the illustrated elements may also be coupled via additional circuit elements, such as resistors, capacitors, transistors, and the like. The specification and drawings should be considered exemplary only, and the scope of the disclosure is accordingly intended to be limited only by the following claims and equivalents thereof

What is claimed is:

1. A method, comprising:

determining a first operational sensitivity of a bitcell to a first component characteristic of a first component of the bitcell;

determining a second operational sensitivity of the bitcell to a second component characteristic of the first component of the bitcell;

determining a third operational sensitivity of the bitcell to a first component characteristic of a second component of the bitcell;

determining a fourth operational sensitivity of the bitcell to a second component characteristic of the second component of the bitcell;

normalizing a first plurality of sensitivities of the bitcell including the first operational sensitivity, the second operational sensitivity, the third operational sensitivity and the fourth operational sensitivity, to produce a first set of normalized sensitivity information for the bitcell;

storing the first set of normalized sensitivity information; and providing the first set of normalized sensitivity information to a device simulator, the device simulator configured to simulate operation of the bitcell.

2. The method of claim 1, further comprising adjusting the first normalized sensitivity information by a tolerance factor.

3. The method of claim 2, wherein the tolerance factor is based on a number of standard deviations associated with a simulation at the device simulator.

4. The method of claim 1, wherein determining the first operational sensitivity of the bitcell comprises determining an operational sensitivity of a read current of the bitcell.

5. The method of claim 4, wherein determining the first operational sensitivity comprises:

setting the second, third, and fourth component characteristics to a defined nominal level;

determining a first read current of the bitcell when the first component characteristic is set to a first level;

determining a second read current of the bitcell when the first component characteristic is set to a second level; and determining the first operational sensitivity based on the first read current and the second read current.

6. The method of claim 5, wherein the first level and the second level are based on a defined standard deviation of the first component characteristic from a defined nominal level.

7. The method of claim 1, wherein the first component is associated with a latch of the bitcell.

8. The method of claim 7, wherein the second component is associated with a pass gate of the bitcell.

9. The method of claim 1, wherein the first component is a transistor of the bitcell.

10. The method of claim 9, wherein the first component characteristic is a threshold voltage of the transistor, and the second component characteristic is channel dimension of the transistor.

11. The method of claim 10, wherein the channel dimension is a channel length.

12. The method of claim 10, wherein the channel dimension is a channel width.

13. The method of claim 1, wherein determining the first operational sensitivity comprises determining the first operational sensitivity based on a first device parameter, and further comprising:

determining a fifth operational sensitivity of the bitcell to the first component characteristic of the first component of the bitcell, the fifth operational sensitivity based on a second device parameter;

determining a sixth operational sensitivity of the bitcell to the second component characteristic of the first component of the bitcell;

determining a seventh operational sensitivity of the bitcell to the first component characteristic of the second component of the bitcell;

determining an eighth operational sensitivity of the bitcell to the second component characteristic of the second component of the bitcell;

normalizing a second plurality of sensitivities including the fifth operational sensitivity, the sixth operational sensitivity, the seventh operational sensitivity and the eighth operational sensitivity to produce a second set of normalized sensitivity information for the bitcell; and storing the second set of normalized sensitivity information.

14. The method of claim 13, wherein the first device parameter is selected from the group consisting of a voltage level, a temperature level, and a semiconductor process type.

15. A method comprising:

receiving a first set of normalized sensitivity information for a bitcell, the first set of normalized sensitivity information representing a first sensitivity of a first component of the bitcell to a first component characteristic, a second sensitivity of the first component of the bitcell to a second component characteristic, a third sensitivity of a second component of the bitcell to a first component characteristic, and a fourth sensitivity of the second component of the bitcell to a second component characteristic;

adjusting the first normalized sensitivity information based on a first tolerance factor to produce first adjusted sensitivity information for the bitcell; and simulating operation of the bitcell based on the first adjusted sensitivity information.

16. The method of claim 15, wherein the first sensitivity information is associated with a read current of the bitcell.

17. The method of claim 15, wherein the first component is a transistor of the bitcell.

18. The method of claim 15, wherein the first set of normalized sensitivity information is associated with a first device characteristic, and further comprising:

receiving a second set of normalized sensitivity information for the bitcell, the second set of normalized sensitivity information representing a fifth sensitivity of the first component of the bitcell to the first component characteristic, a sixth sensitivity of the first component of the bitcell to the second component characteristic, a seventh sensitivity of the second component of the bitcell to the first component characteristic, and an eighth sensitivity of the second component of the bitcell to the second component characteristic, the second set of normalized sensitivity information associated with a second device characteristic;

adjusting the second normalized sensitivity based on a second tolerance factor to produce second adjusted sensitivity information for the bitcell; and simulating operation of the bitcell based on the second adjusted sensitivity information.

19. A computer readable medium storing a program comprising instructions to manipulate a processor, the instructions, when executed, causing the processor to execute instructions to:

determine a first operational sensitivity of a bitcell to first component characteristic of a first component of the bitcell;

determine a second operational sensitivity of the bitcell to a second component characteristic of the first component of the bitcell;

determine a third operational sensitivity of the bitcell to a first component characteristic of a second component of the bitcell;

determine a fourth operational sensitivity of the bitcell to a second component characteristic of the second component of the bitcell;

normalize a first plurality of sensitivities of the bitcell including the first operational sensitivity, the second operational sensitivity, the third operational sensitivity and the fourth operational sensitivity to produce a first set of normalized sensitivity information for the bitcell;

store the first normalized sensitivity information; and provide the first set of normalized sensitivity information to a device simulator, the device simulator configured to simulate operation of the bitcell.

* * * * *